United States Patent [19]
Luning et al.

[11] Patent Number: 6,015,736
[45] Date of Patent: Jan. 18, 2000

[54] METHOD AND SYSTEM FOR GATE STACK REOXIDATION CONTROL

[75] Inventors: Scott D. Luning, San Francisco; Mark Randolph, San Jose, both of Calif.

[73] Assignee: Advanced Micro Devices, Inc., Sunnyvale, Calif.

[21] Appl. No.: 08/993,787

[22] Filed: Dec. 19, 1997

[51] Int. Cl.$^7$ .................................................. H01L 21/26
[52] U.S. Cl. .......................... 438/264; 438/265; 438/911; 29/25.01
[58] Field of Search ..................................... 438/264, 440, 438/407, 257, 265, 211, 911; 257/315

[56] References Cited

U.S. PATENT DOCUMENTS

| | | | |
|---|---|---|---|
| 4,098,618 | 7/1978 | Crowder et al. ........................ | 148/1.5 |
| 4,789,883 | 12/1988 | Cox et al. ............................... | 357/23.7 |
| 4,885,259 | 12/1989 | Osinski et al. .......................... | 438/303 |
| 4,912,062 | 3/1990 | Verma ..................................... | 438/69 |
| 5,077,230 | 12/1991 | Woo et al. ............................... | 438/43 |
| 5,208,175 | 5/1993 | Choi et al. ............................... | 438/261 |
| 5,358,894 | 10/1994 | Frazan et al. ........................... | 438/70 |
| 5,360,751 | 11/1994 | Lee .......................................... | 438/35 |
| 5,550,070 | 8/1996 | Funai et al. .............................. | 438/41 |
| 5,592,415 | 1/1997 | Kato et al. .............................. | 365/185.01 |
| 5,595,922 | 1/1997 | Tigelaar et al. ......................... | 438/587 |
| 5,599,731 | 2/1997 | Park ......................................... | 438/70 |
| 5,648,287 | 7/1997 | Tsai et al. ............................... | 438/44 |
| 5,680,345 | 10/1997 | Hsu et al. ............................... | 365/185.01 |

OTHER PUBLICATIONS

Applicants Admitted Prior Art, p. 4, lines 1–21.

*Primary Examiner*—Wael M. Fahmy
*Assistant Examiner*—Kurt Eaton
*Attorney, Agent, or Firm*—Sawyer & Associates

[57] ABSTRACT

A system and method for providing at least one memory cell on a semiconductor is disclosed. The method and system include providing a tunneling barrier on the semiconductor, providing at least one floating gate having a corner, and oxidizing the tunneling barrier, a portion of the semiconductor, and the at least one floating gate. A portion of the at least one floating gate including the corner is disposed above the tunneling barrier. The portion of the semiconductor oxidizes at a first rate and at least the corner of the at least one floating gate oxidizes at a second rate. The second rate is sufficiently higher than the first rate to provide a desired thickness of the tunneling barrier a distance from the corner of the at least one floating gate for a particular rounding of the corner of the at least one floating gate.

20 Claims, 3 Drawing Sheets

METHOD AND SYSTEM FOR GATE STACK REOXIDATION CONTROL

FIELD OF THE INVENTION

The present invention relates to flash memory technology and more particularly to a method and system for controlling the profile of a gate stack during reoxidation.

BACKGROUND OF THE INVENTION

A conventional flash memory cell includes a gate stack, a source, a drain, and a channel disposed between the source and the drain. To form a conventional memory cell, a tunnel oxide is grown on a semiconductor substrate. Typically, the gate stack is then formed on the tunnel oxide. The gate stack is then exposed to an oxidizing agent at a high temperature to grow a layer of oxide on the gate stack. Once the growth of the oxide layer is completed, the source and drain are implanted.

The oxide layer is grown on the gate stack of the conventional memory cell for several purposes. One purpose of the oxide layer is round the corner of the floating gate. This rounding reduces electric fields which would otherwise be highly concentrated at the corner when the memory cell is biased, for example during an erase.

Although oxidizing the gate stack rounds the corner of the floating gate, the oxidation step also thickens the tunnel oxide just under the edge of the floating gate. As the corner of the floating gate rounds, the oxide on the surface of the silicon continues to grow. The tunnel oxide also continues to grow under the edges of the floating gate, resulting in a "bird's beak" shaped tunnel oxide near the edge of the floating gate.

The bird's beak shape of the tunnel oxide is undesirable for many reasons. For example, the bird's beak shaped tunnel oxide adversely affects erase and placement of the source. In order to erase the conventional memory cell, charge carriers tunnel from the floating gate to the source. Tunneling of charge carriers depends in part on the thickness of tunnel oxide through which the charge carriers must tunnel. To increase tunneling and raise erase efficiency, the tunnel oxide between the source and floating gate should be thin. Because of the bird's beak shape, the source is typically driven farther under the gate to reach a thinner portion of the tunnel oxide. Driving the source farther under the gate makes the channel smaller. As a result, short channel effects which degrade the performance of the memory cell, increase.

Accordingly, what is needed is a system and method for providing a memory cell having a reduced gate edge bird's beak. The present invention addresses such a need.

SUMMARY OF THE INVENTION

The present invention provides a method and system for providing at least one memory cell on a semiconductor. The method and system comprise providing a tunneling barrier on the semiconductor, providing at least one floating gate having a corner, and oxidizing the tunneling barrier, a portion of the semiconductor, and the at least one floating gate. A portion of the at least one floating gate including the corner is disposed above the tunneling barrier. The portion of the semiconductor oxidizes at a first rate and at least the corner of the at least one floating gate oxidizes at a second rate. The second rate is sufficiently higher than the first rate to provide a desired thickness of the tunneling barrier a distance from the corner of the at least one floating gate for a particular rounding of the corner of the at least one floating gate.

According to the system and method disclosed herein, the present invention provides a memory cell having a reduced bird's beak in the tunnel barrier, thereby increasing overall system performance.

DETAILED DESCRIPTION OF THE INVENTION

The present invention relates to an improvement in flash memory technology. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
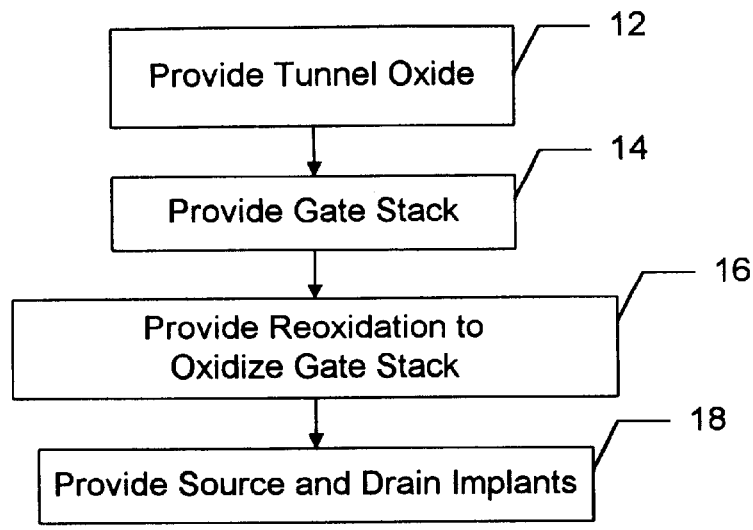
FIG. 1 is flow chart of a conventional method for forming a flash memory cell.

FIG. 1 is a flow chart of a conventional method 10 for providing a flash memory cell. Only certain steps in the process are depicted in the method 10 of FIG. 1. A tunnel oxide is grown on a semiconductor substrate via step 12. A gate stack is then provided via step 14. Formation of a gate stack typically includes depositing layers of polysilicon separated by an oxide/nitride/oxide film and etching these layer to provide gate stacks. Typically, the gate stack includes a floating gate and a control gate which are each composed of polysilicon. The gate stack is then oxidized via step 16. This step is known as reoxidation. Source and drain implants are then provided via step 18. The source implant typically includes a phosphorus implant and an arsenic implant.

Figure 2:
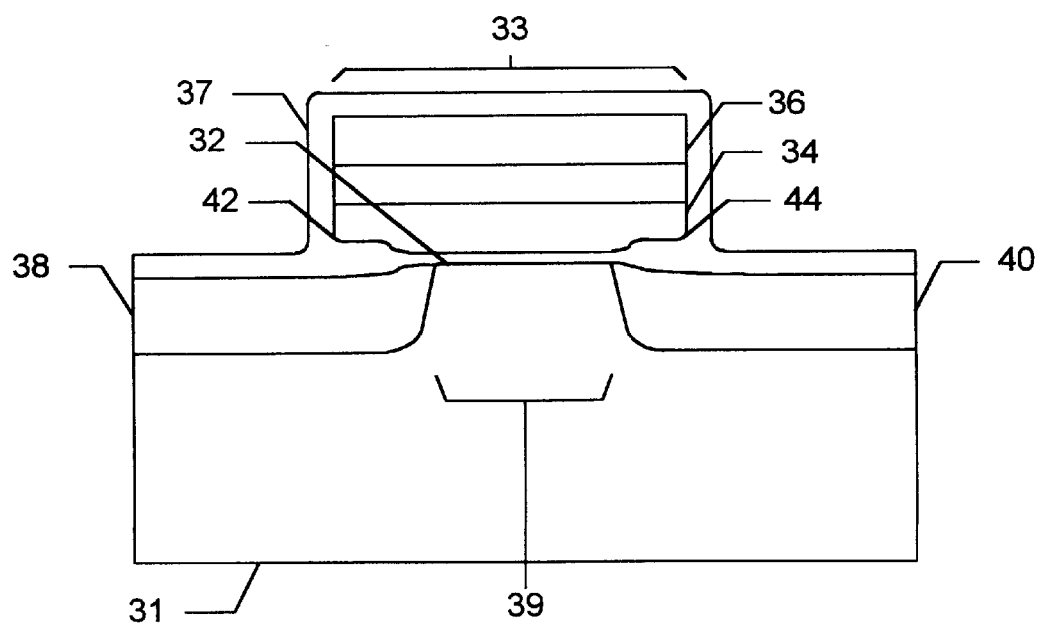
FIG. 2 is a schematic of a conventional flash memory cell.

FIG. 2 depicts a cross-section of a conventional flash memory cell 30 formed on a semiconductor 31 using the method 10. The conventional memory cell 30 includes a tunnel oxide 32, a gate stack 33 having at least a floating gate 34 and a control gate 36. The floating gate 34 includes corners 42 and 44. Although depicted in two dimensions, the memory cell 30 is in three dimensions. Thus, although depicted as a two dimensional edge, the edge of the gate stack 33 is a three dimensional vertical face. Therefore, in the context of this application, an edge is a three dimensional vertical face. Similarly, although depicted in two dimensions, the corners 42 and 44 are three dimensional edges of the floating gate 34. Thus, in the context of this application, a corner is a three dimensional edge of a gate. The conventional memory cell 30 also includes an oxide layer 37 grown during the oxidation step 16, a source 38, and a drain 40. A channel 39 is disposed between the source 38 and the drain 40.

Growth of the oxide layer 37 during reoxidation step 16 rounds corners 42 and 44 of the floating gate 34. After the polysilicon is etched to form the gate stack 33 in step 14, the corners of the floating gate 34 are typically sharp. Thus, electric fields are concentrated at the corners 42 and 44 of the floating gate 34 when the gate stack 33 is biased. Concentration of electric fields at the corners 42 and 44 stresses the tunnel oxide 32, contributing to breakdown of the tunnel oxide 32 and failure of the conventional memory cell 30. The corners 42 and 44 are rounded to reduce electric fields are concentrated at the corners 42 and 44 of the floating gate 34 and improve reliability of the conventional memory cell 30.

Although the conventional memory cell 30 shown in FIG. 2 functions, those with ordinary skill in the art will realize that growth of the oxide layer 37 during reoxidation causes the tunnel oxide 32 to have a "bird's beak" shape. The oxide layer 37 grows on the gate stack 33 and semiconductor 31 because an oxidizing species forms the oxide at the edges of the gate stack 33. The oxidizing species also diffuses laterally through an oxide, causing additional oxide to grow in a portion of the space between the floating gate 34 and the semiconductor 31. The growth of additional oxide between the floating gate 34 and the semiconductor 31 causes the portion of the tunnel oxide 32 near the edges of the floating gate 34 to thicken in comparison to the portion of the tunnel oxide 32 near the center of the floating gate 34. This phenomenon results in a profile of the tunnel oxide 32 known as the "bird's beak."

The bird's beak in the tunnel oxide 32 requires that the source 38 be driven farther under the floating gate 34. An erase in a conventional memory cell is carried out through tunneling of charge carriers between the floating gate 34 and the source 38. Tunneling of charge carriers depends upon the concentration of dopant in the source 38 and the thickness of the tunnel oxide 34. Tunneling increases exponentially as the source 38 and floating gate 34 grow closer. The bird's beak increases the thickness of the tunnel oxide 32 near the edge of the floating gate 34. Thus, for a uniform profile of source dopant, tunneling increases closer to the center and away from the edge of the gate stack 33. Tunneling also increases with increasing concentration of the source dopant.

Because the source 38 is driven farther under the floating gate 34, the channel 39 is shortened, increasing undesirable short channel effects. Short channel effects adversely affect the performance of the memory cell 30. For example, short channel effects can cause a leakage of charge carriers between the source 38 and drain 40. To reduce short channel effects, the conventional memory cell 30 must be made larger. Consequently, fewer conventional memory cells 30 can be packed in a given area of the semiconductor 31.

The present invention provides for a method and system for providing a memory cell on a semiconductor. The method and system comprise providing a tunneling barrier on the semiconductor, providing at least one floating gate having a corner, and oxidizing the tunneling barrier, a portion of the semiconductor, and the at least one floating gate. A portion of the at least one floating gate including the corner is disposed above the tunneling barrier. The portion of the semiconductor oxidizes at a first rate and at least the corner of the at least one floating gate oxidizes at a second rate. The second rate is sufficiently higher than the first rate to provide a desired thickness of the tunneling barrier a distance from the corner of the at least one floating gate for a particular rounding of the corner of the at least one floating gate.

The present invention will be described in terms of providing a single cell using particular surface treatments. However, one of ordinary skill in the art will readily recognize that this method and system will operate effectively for other methods including other steps and which provide multiple cells in a single process. Moreover, the method and system will function effectively for other treatments or systems having a large enough differential oxidation rate between a side of a gate stack and a semiconductor.

Figure 3A:
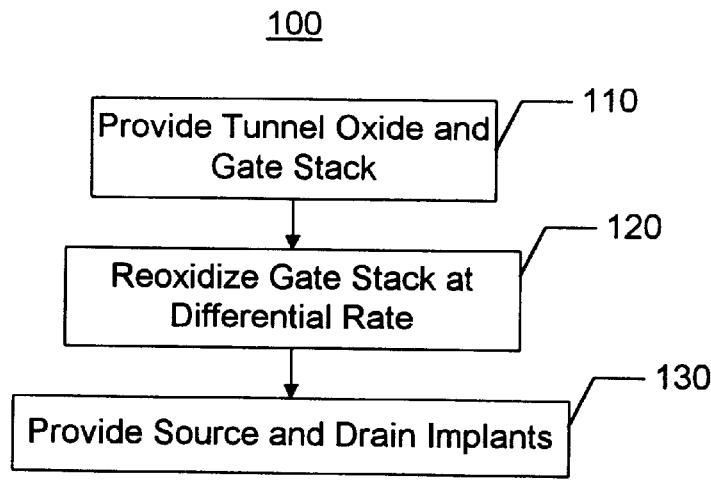
FIG. 3A is a flow chart of a method for providing a memory cell in accordance with the method and system.

To more particularly illustrate the method and system in accordance with the present invention, refer now to FIG. 3A depicting a flow chart of one embodiment of a method 100 for providing a flash memory cell in accordance with the method and system.

A tunnel barrier and gate stack are provided on a semiconductor substrate via step 110. The tunnel oxide and gate stack may be provided using conventional methods. Differential reoxidation is then carried out via step 120. During differential reoxidation step 120, gate stack is then oxidized at a differential rate from oxidation of the surface of the underlying semiconductor. In one embodiment, the oxidation rate of at least the edge of the gate stack is at least 1.5 times the oxidation rate of the portion of the semiconductor under the gate stack. In a preferred embodiment, the oxidation rate of at least the edge of the gate stack is at least two times as high as the oxidation rate of the portion of the semiconductor underlying the gate stack. Oxidation of the gate stack via step 20 rounds the corners of the gate stack. The differential rate of oxidation allows the gate stack to oxidize much more quickly than a portion of the semiconductor which is adjacent to the gate stack. The source and drain implants are then provided via step 130.

Figure 3B:
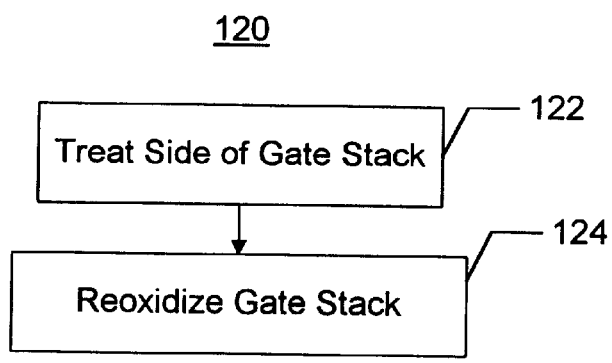
FIG. 3B is a flow chart of a first embodiment of a method for oxidizing the gate stack and semiconductor at differential rates in accordance with the method and system.
Figure 3C:
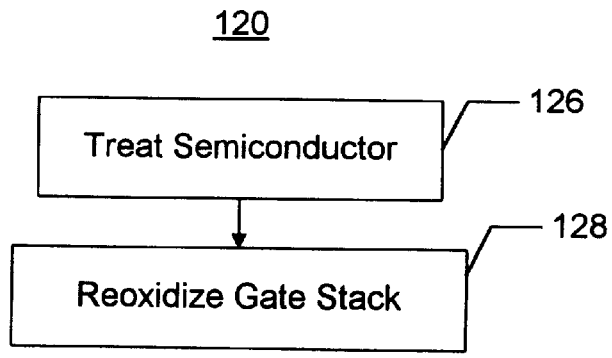
FIG. 3C is a flow chart of a second embodiment of a method for oxidizing the gate stack and the semiconductor at differential rates in accordance with the method and system.

FIGS. 3B and 3C depict first and second embodiments, respectively, of methods for reoxidizing the gate stack at a differential rate. Referring to FIG. 3B, first the side of the gate stack is treated via step 122. In a preferred embodiment, an implant is provided at a high angle in step 122 to impact the side of the gate stack. The implant allows the gate stack, which otherwise may oxidize at approximately the same rate as the semiconductor, to oxidize at a higher rate. In another embodiment, the surface of the side of a polysilicon gate stack is treated via step 122 to be amorphous. An oxide may grow more rapidly on an amorphous surface than on a crystalline surface. Thus, the surface of the gate stack will oxidize more rapidly than the exposed semiconductor. The gate stack is then oxidized via step 124.

Referring now to FIG. 3C depicting another embodiment of the differential reoxidation step 120. The semiconductor is treated via step 126. Because of the treatment in step 126, the oxidation of the surface of the semiconductor adjacent to the gate stack is slowed. In one embodiment, the semiconductor is silicon and the treatment step 126 includes implanting nitrogen in the semiconductor. Reoxidation is then carried out via step 128.

Figure 4:
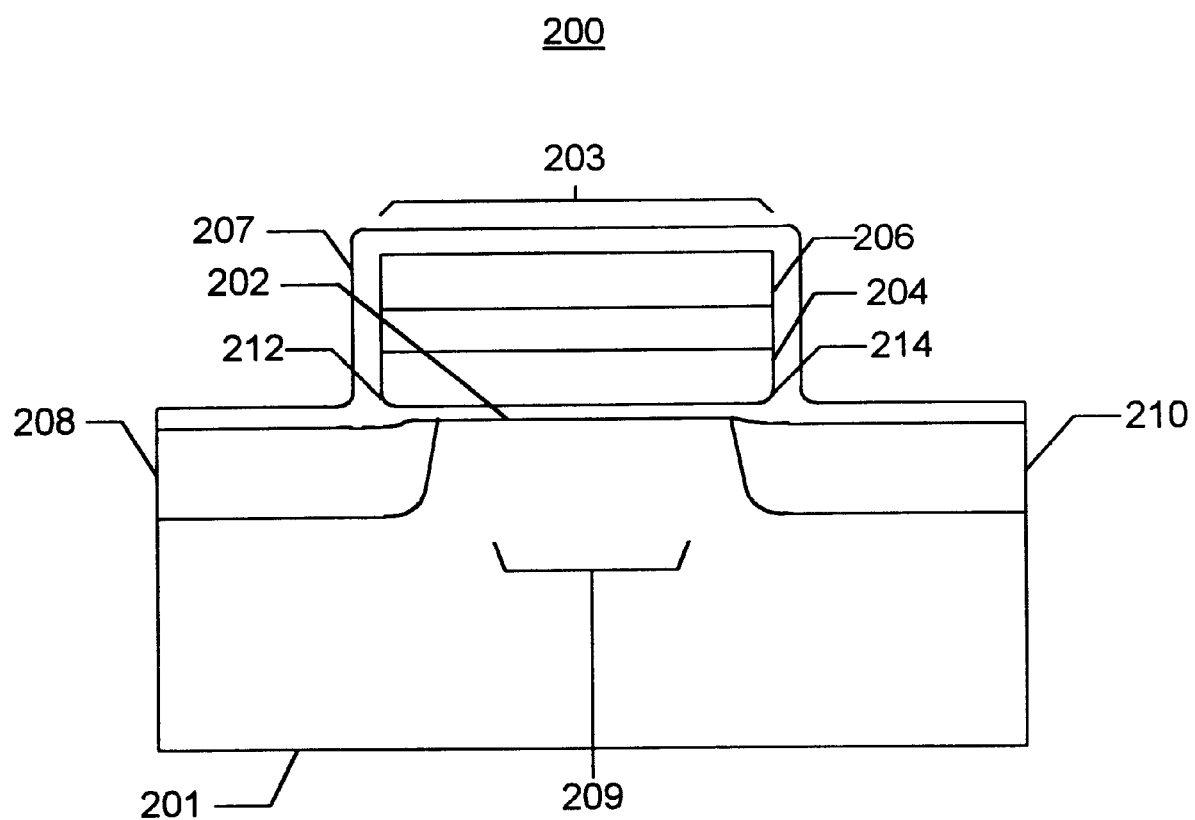
FIG. 4 is a schematic of a memory cell in accordance with the method and system.

FIG. 4 depicts one embodiment of a memory cell 200 formed in accordance with the present invention. The memory cell 200 is formed on a semiconductor 201. The memory cell 200 includes a tunnel oxide 202 and a gate stack 203. In a preferred embodiment, the gate stack 203 includes at least a floating gate 204 and a control gate 206. The floating gate 204 includes corners 212 and 214. In a preferred embodiment, the floating gate 204 and control gate 206 are composed of polysilicon. The memory cell 200 also includes source 208, drain 210, and channel 209 disposed between the source 208 and the drain 210. The memory cell 200 also includes an oxide layer 207 grown at least in part during the differential reoxidation step 120.

Because the floating gate 204 oxidizes sufficiently faster than the semiconductor 201, the semiconductor 201 will oxidize less for a given thickness of the portion of the oxide layer 207 on the side of the gate stack 303. For a particular rounding of the corners 212 and 214 of the floating gate 204, less oxide is grown on the semiconductor 201. Less oxide is grown under the edges of the floating gate 204 for the desired rounding of the corners 212 and 214. The bird's beak shape in the tunnel oxide 202 is smaller and extends less far under the floating gate 212 than in the conventional memory cell 30. In other words, the bird's beak, the thickness of the tunnel oxide 202 a given distance from the edge of the floating gate 204, for a particular rounding of the corner 212 or 214 of the floating gate 204 is reduced.

The reduced size of the bird's beak in the tunnel oxide 202 for a given corner 212 or 214 rounding is desirable for several reasons. Because the bird's beak in the tunnel oxide 202 is smaller, the source 208 need not be driven as far under the floating gate 204 to improve erase characteristics without substantially increasing short channel effects for a gate stack 203 of a particular size. Moreover, the memory cell 200 can be made smaller because less underdiffusion of the source 208 is required. Consequently, smaller memory cells 200 can be provided. As a result, more memory cells 200 can be packed on a given area of the semiconductor 201.

A method and system has been disclosed for providing a memory cell having a reduced bird's beak. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for providing at least one memory cell on a semiconductor comprising the steps of:
   (a) providing a tunneling barrier on the semiconductor;
   (b) providing at least one floating gate having a corner, a portion of the at least one floating gate including the corner being disposed substantially above the tunneling barrier; and
   (c) oxidizing the tunneling barrier, a portion of the semiconductor adjacent the at least one floating gate, and the portion of the at least one floating gate;
   wherein the portion of the semiconductor oxidizes at a first rate and at least the corner of the at least one floating gate oxidizes at a second rate, the second rate being sufficiently higher than the first rate to provide a desired thickness of the tunneling barrier a distance from the corner of the at least one floating gate for a particular rounding of the at least one floating gate.

2. The method of claim 1 wherein the oxidizing step (c) further includes the step of:
   (c1) providing a treatment of a second portion of the at least one floating gate to allow at least the corner of the at least one floating gate to oxidize at the second rate, the second rate being higher than a rate at which the at least one floating gate would oxidize without the treatment.

3. The method of claim 2 wherein the at least one floating gate includes a side; and treatment providing step (c1) further includes the step of:
   (c1i) implanting a dopant into the side of the at least one floating gate.

4. The method of claim 3 further comprising the step of:
   (d) providing at least one control gate disposed above the floating gate.

5. The method of claim 2 wherein the treatment providing step (c1) further includes the step of:
   (c1i) ensuring that the side of the at least one floating gate has an amorphous structure.

6. The method of claim 5 further comprising the step of:
   (d) providing at least one control gate disposed above the floating gate.

7. The method of claim 1 wherein the semiconductor further includes a surface; and wherein oxidizing step (c) further includes the step of:
   (c1) providing a treatment of a second portion of the semiconductor adjacent to the at least one floating gate to allow at least a portion of the surface to oxidize at the first rate, the first rate being lower than a rate at which the surface of the semiconductor would oxidize without the treatment.

8. The method of claim 7 wherein the semiconductor includes silicon; and wherein the treatment providing step (c1) further includes the step of:
   (c1i) providing a nitrogen implant.

9. The method of claim 7 further comprising the steps of:
   (e) providing a source implant in the semiconductor; and
   (f) providing a drain implant.

10. The method of claim 9 further comprising the step of:
    providing at least one control gate disposed above the floating gate.

11. A system for providing at least one memory cell on a semiconductor comprising:
    means for providing a tunneling barrier on the semiconductor;
    means for providing at least one floating gate having a corner, a portion of the at least one floating gate including the corner being disposed substantially above the tunneling barrier; and
    means for oxidizing a portion of the semiconductor adjacent the floating gate, the tunneling barrier, and the portion of the at least one floating gate;
    wherein the portion of the semiconductor oxidizes at a first rate and at least the corner of the at least one floating gate oxidizes at a second rate, the second rate being sufficiently higher than the first rate to provide a desired thickness of the tunneling barrier a distance from the corner of the at least one floating gate for a particular rounding of the corner of the at least one floating gate.

12. The system of claim 11 wherein the oxidizing means further include:
    means for providing a treatment of a portion of the at least one floating gate to allow at least the corner of the at least one floating gate to oxidize at the second rate, the second rate being higher than a rate at which the at least one floating gate would oxidize without the treatment.

13. The system of claim 12 wherein the at least one floating gate includes a side; and the treatment providing means further include:
    means for implanting a dopant into the side of the at least one floating gate.

14. The system of claim 13 further comprising means for providing a control gate disposed above the floating gate.

15. The system of claim 12 wherein the treatment providing means further include:
    means for ensuring that the side of the at least one floating gate has an amorphous structure.

16. The system of claim 15 further comprising the step of: providing a control gate disposed above the floating gate.

17. The system of claim 11 wherein the semiconductor further includes a surface; and wherein the oxidizing means further include:
  means for providing a treatment of a second portion of the semiconductor adjacent to the at least one floating gate to allow at least a portion of the surface to oxidize at the first rate, the first rate being lower than a rate at which the surface of the semiconductor would oxidize without the treatment.

18. The system of claim 17 wherein the semiconductor includes silicon; and wherein the treatment providing means further include:
  means for providing a nitrogen implant.

19. The system of claim 18 further comprising:
  means for providing a source implant in the semiconductor; and
  means for providing a drain implant.

20. The system of claim 19 further comprising means for providing a control gate disposed above the floating gate.

* * * * *